United States Patent
Bauert et al.

(10) Patent No.: US 11,607,683 B2
(45) Date of Patent: Mar. 21, 2023

(54) MICROFLUIDIC DEVICE AND METHOD FOR MANUFACTURING A MICROFLUIDIC DEVICE

(71) Applicant: IMT Masken und Teilungen AG, Greifensee (CH)

(72) Inventors: Tobias Bauert, Rikon im Toesstal (CH); Daniel Grogg, Ottikon (CH)

(73) Assignee: IMT MASKEN UND TEILUNGEN AG, Greifensee (CH)

( * ) Notice: Subject to any disclaimer, the term of this patent is extended or adjusted under 35 U.S.C. 154(b) by 219 days.

(21) Appl. No.: 17/098,470

(22) Filed: Nov. 16, 2020

(65) Prior Publication Data
US 2021/0154660 A1 May 27, 2021

(30) Foreign Application Priority Data

Nov. 21, 2019 (EP) ..................................... 19210724

(51) Int. Cl.
*B01L 3/00* (2006.01)
*H01L 21/02* (2006.01)
*H01L 21/311* (2006.01)

(52) U.S. Cl.
CPC ...... *B01L 3/5027* (2013.01); *H01L 21/02002* (2013.01); *H01L 21/31144* (2013.01)

(58) Field of Classification Search
CPC .......... B01L 3/5027; B01L 2300/0645; B01L 3/502707; H01L 21/02002; H01L 21/31144
USPC ......................................................... 216/67
See application file for complete search history.

(56) References Cited

U.S. PATENT DOCUMENTS

| | | | | |
|---|---|---|---|---|
| 5,525,190 A | * | 6/1996 | Wojnarowski | G02B 6/13 216/33 |
| 5,554,488 A | * | 9/1996 | Rioux | H01L 21/0331 257/E21.034 |
| 6,180,536 B1 | | 1/2001 | Chong et al. | |
| 8,563,325 B1 | | 10/2013 | Bartsch et al. | |
| 9,620,373 B1 | * | 4/2017 | Chakravarty | H01L 29/401 |
| 2017/0194195 A1 | * | 7/2017 | Cohen | H01L 21/0331 |
| 2019/0143321 A1 | | 5/2019 | Delamarche et al. | |

* cited by examiner

*Primary Examiner* — Duy Vu N Deo
(74) *Attorney, Agent, or Firm* — Leydig, Voit & Mayer, Ltd.

(57) ABSTRACT

A method for manufacturing a microfluidic device includes providing a first substrate having a first surface and a second surface located opposite the first surface. An etching mask is produced on the first surface, the etching mask having an opening. A recess is produced by etching in the first surface in a region of the opening. An electrically conductive material is deposited on the etching mask and/or a layer covering the etching mask, and on a region of a bottom of the recess below the opening.

11 Claims, 3 Drawing Sheets

MICROFLUIDIC DEVICE AND METHOD FOR MANUFACTURING A MICROFLUIDIC DEVICE

CROSS-REFERENCE TO PRIOR APPLICATIONS

Priority is claimed to European Patent Application No. 19 210 724.1, filed on Nov. 21, 2019, the entire disclosure of which is hereby incorporated by reference herein.

FIELD

The present invention relates to a microfluidic device, and to methods for manufacturing a microfluidic device.

BACKGROUND

Microfluidic devices are designed to accommodate and/or conduct fluids, in particular liquids, in or into structures that have, at least partially, dimensions in the micrometer range (such as from a few micrometers to several hundred micrometers). For example, microfluidic devices in the form of so-called "lab-on-a-chip" systems are used for medical or, in general terms, biotechnology applications. Accordingly, such microfluidic devices are sometimes also referred to as microfluidic chips. It is furthermore known to use microfluidic devices in the form of so-called flow cells, for example for diagnostic purposes, and specifically for DNA sequencing.

Such a microfluidic device usually comprises a first substrate, for example made of glass, quartz or silicon, having a surface in which one or more recesses are provided, the recess(es) forming one or more cavities and/or channels. Suitable chemicals, electrodes, etc. can be arranged in the cavities and/or channels according to the particular function of the microfluidic device.

The cavities and/or channels are usually closed toward the top by a "cover" in the form of a second substrate.

Within the scope of the present description, information such as "toward the top," "upper," "on," "toward the bottom," "lower," etc. merely represents relative information that denotes spatial relationships of different components with respect to one another once a reference system has been established, but does not define an absolute orientation in the space.

The termination of the cavities and/or channels by the second substrate in particular has to be fluid-tight (at least in sections). In the application, for example, an analyte may then be pushed through the channels, and the corresponding analysis can be carried out.

The first substrate and/or the second substrate may be provided in the form of a wafer (e.g., made of glass or silicon) or as part of such a wafer. In this case, the two wafers can be glued together, for example, using so-called wafer bonding, thereby closing the channel toward the top in the fluid conduction part by means of the closure part.

For example, during the so-called adhesive bonding, an areal connection is created between two wafers (such as glass wafers) by means of a thin adhesive film. This form of joining technique is used in particular in the case of components that must not be exposed to elevated temperatures in subsequent process steps, e.g., because metals or biological functional structures are already present, which do not tolerate a higher temperature budget.

As an alternative to adhesive bonding, it is furthermore known to attach a surface of the second substrate by way of direct bonding (or fusion bonding) to the surface of the second substrate. Such a method does not require any adhesive or other intermediate layers. Instead, the attachment is based on chemical bonds between the surfaces, such as van der Waals forces, hydrogen bonds or strong covalent bonds.

A prerequisite for this is that the surfaces involved are sufficiently clean, flat and smooth. In particular, the surfaces must not include any excessively large particles or protrusions. In other words, the surfaces must have an extremely low surface roughness, for example of less than 0.5 nm, in order to enable direct bonding. Any particle having a particle diameter of 0.5 nm or more may result in non-contact sites (also referred to as flaws or "voids") between the surfaces involved, wherein a diameter of the non-contact sites is usually larger than the particle diameter by approximately a factor of 10,000. For example, a 100 nm particle having a particle diameter of 100 nm may result in a void having a diameter of approximately 1 mm.

Due to the above-described high requirements with regard to the properties of the substrate surfaces, the direct bonding of wafers, in particular glass wafers, to structured surfaces at the bond interface is generally not possible. In such cases, alternative bonding techniques, such as the aforementioned adhesive bonding, are thus commonly employed, which are capable of burying the steps of the structures or otherwise preventing voids from forming around the structures.

In microfluidic devices, however, electrically conductive structures in the region of a surface of the first substrate are sometimes required from a functional perspective, for example as metallic electrodes. It is nonetheless desirable to enable direct bonding to the surface of a second substrate.

A manufacturing method for an optical waveguide is known from U.S. Pat. No. 5,525,190 A where channels formed in a surface of a substrate are provided with a reflective metal layer from the inside. In this case, the metal layer is first deposited across the entire surface and on channel bottoms and walls. The deposited metal is subsequently ground off the surface, so that it only remains in the channels and is structured accordingly. However, such a procedure, if it were applied to the creation of metallic structures in microfluidic devices, would not readily result in a sufficiently smooth surface that would allow direct bonding to another substrate. Therefore, complicated grinding and/or polishing processes would possibly be necessary in order to create the prerequisites for direct bonding.

SUMMARY

In an embodiment, the present invention provides a method for manufacturing a microfluidic device. A first substrate having a first surface and a second surface located opposite the first surface is provided. An etching mask is produced on the first surface, the etching mask having an opening. A recess is produced by etching in the first surface in a region of the opening. An electrically conductive material is deposited on the etching mask and/or a layer covering the etching mask, and on a region of a bottom of the recess below the opening.

BRIEF DESCRIPTION OF THE DRAWINGS

Embodiments of the present invention will be described in even greater detail below based on the exemplary figures. The present invention is not limited to the exemplary embodiments. All features described and/or illustrated herein can be used alone or combined in different combinations in embodiments of the present invention. The features and advantages of various embodiments of the present invention will become apparent by reading the following detailed description with reference to the attached drawings which illustrate the following.

DETAILED DESCRIPTION

Figure 1A:
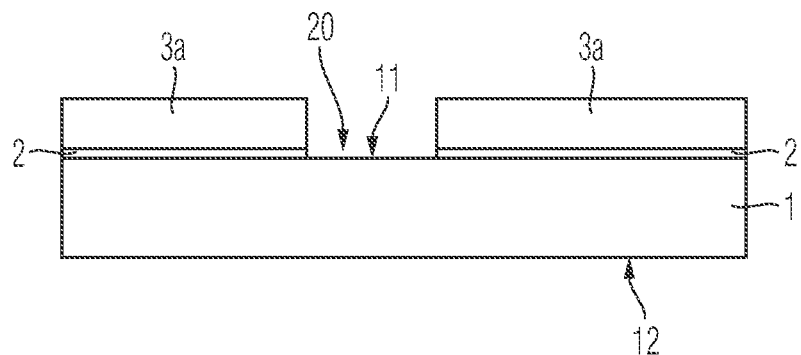
FIGS. 1A-H schematically and by way of example show different steps and intermediate stages in a method for manufacturing a microfluidic device according to one or more exemplary embodiments.

In an embodiment, the present invention provides a method for manufacturing a microfluidic device which is as cost-efficient as possible and in which electrically conductive structures are arranged in the region of a surface of a first substrate. In any case, the method is to be compatible, in principle, with a direct bonding of the surface to a second substrate, i.e., it should in particular be able to result in a sufficiently smooth surface.

In another embodiment, the present invention provides a corresponding microfluidic device that can be manufactured by such a method.

According to a first embodiment, a method for manufacturing a microfluidic device is provided. The method initially comprises the following steps: providing a first substrate having a first surface and a second surface located opposite the first surface; producing an etching mask on the first surface, the etching mask having an opening; creating, by means of etching, a recess in the first surface in the region of the opening. The method furthermore comprises depositing an electrically conductive material on the etching mask and/or a layer covering the etching mask, and on a region of a bottom of the recess below the opening.

An advantageous embodiment of the method comprises the following steps, before the deposition of the electrically conductive material: applying a photoresist onto the etching mask and onto a region of a bottom of the recess below the opening; and removing the resist from the recess. In this embodiment, the electrically conductive material is deposited onto the photoresist covering the etching mask, and onto a region of a bottom of the recess below the opening. The electrically conductive material can be deposited, in particular, onto the region of the bottom of the recess from which the photoresist was removed in the previous method step.

The etching mask is preferably undercut at least partially laterally when the recess is produced, so that at least one lateral edge section of the etching mask protrudes beyond an edge of the recess.

The first substrate is preferably present in the form of a wafer, for example made of glass. The first surface may, for example, be a section of a front wafer surface (wafer front side). Accordingly, the second surface may be a section of a rear-side wafer surface (wafer rear side).

According to a second embodiment, a microfluidic device which has been manufactured by means of a method according to an embodiment of the present invention is provided.

According to a third embodiment, a microfluidic device comprises a first substrate having a channel formed therein, wherein an electrically conductive material is arranged in the channel, and wherein a bottom of the channel has lateral roundings in a cross section, in particular in the form of etching radii. In the region of the roundings, the channel is free of the electrically conductive material.

For example, such a microfluidic device may have been manufactured by a method according to an embodiment of the present invention.

Hereafter, reference will be made to all of the aforementioned embodiments.

Embodiments of the present invention achieve a microfluidic device which is as cost-efficient as possible and in which electrically conductive structures are arranged in the region of a surface of a first substrate by etching one or more recesses, e.g. in the form of one or more channels, into the first substrate in a manner matching the conductive structures to be produced. The structured etching mask used in the process remains in place after the channel has been etched. As a result, the subsequent process steps for producing the electrically conductive structures become self-aligning. In particular, subsequent coating processes may be carried out over the entire surface of a wafer, without the need to carry out a targeted adjustment with respect to the etched recess(es).

The provided self-aligning method is both robust and cost-effective. A further advantage of the provided method is that direct bonding is also possible in this way with metallic electrodes (recessed in recesses) at the bond interface.

In a microfluidic device manufactured according to an embodiment of the invention, the use of the self-aligning method may be manifested in particular in the absence of metallic conductive material in the etching radii of the isotropically etched recess(es).

According to one embodiment, the removal of the photoresist from the recess includes exposing the photoresist in the recess. In the process, an exposure can take place through the second surface, i.e., for example, from the rear side of the wafer.

In the process, the first substrate is preferably transparent to light that is suitable for an exposure of the photoresist. This makes it possible for the photoresist in the recess to be exposed through the second surface using flood exposure.

In contrast, it may be provided that the etching mask is not transparent to light that is used for the exposure of the photoresist. Thus, in the case of flood exposure through the second surface, the photoresist is not exposed on the etching mask.

In this way, the photoresist can be deliberately removed from the recess by exposure from the rear side, and by subsequent development, whereas the photoresist remains in place on the front side of the etching mask.

According to one advantageous embodiment, during the deposition, a layer thickness of the electrically conductive material in the recess is selected so as to be smaller than a depth of the recess. Later, this allows direct bonding of the first surface to the surface of a second substrate, without the electrically conductive material being in the way.

According to a preferred embodiment, the recess is a channel having a depth in the range of 0.01 μm to 5.0 μm, preferably in the range of 0.1 μm to 1.0 μm, such as 0.5 μm.

Alternatively, or additionally, it may be provided that the recess is a channel having a width in the range of 1 μm to 5000 μm, preferably in the range of 1 μm to 500 μm, such as 100 μm.

In an embodiment, the provided method further comprises removing the etching mask. Depending on the material of the etching mask, this can be accomplished, for example, by etching. For example, if chromium is the material used for the etching mask, the etching mask may be removed by means of chromium etching.

It may furthermore be provided that the first surface has a surface roughness of less than 0.5 nm. In this way, reliable direct bonding of the first surface to a surface of a second substrate, for example in the form of a second wafer, becomes possible.

It is, namely, also within the scope of an embodiment of the invention that, in a further method step, a second substrate can be attached to the first surface by means of wafer bonding, in particular direct bonding.

In one embodiment, a surface of the second substrate may include a recess, wherein the surface of the second substrate is attached to the first surface in such a way that the recess of the first substrate and the recess of the second substrate are located opposite one another. For example, when a recessed metal electrode is accommodated on the first substrate, and a microfluidic channel is accommodated on the second substrate, direct contact between a medium (fluid) in the microfluidic channel and the metal electrode can be established.

Glass, quartz or silicon may be used as preferred materials for the first substrate and/or the second substrate. Glass wafers in particular are suitable for the above-described manufacturing variant of a microfluidic device by means of wafer bonding.

A microfluidic device according to the third embodiment can also be produced in particular by means of a method according to an embodiment of the present invention. Accordingly, the above and subsequent explanations with respect to the method according to embodiments thereof can be analogously applied to the microfluidic devices according to the second embodiment and third embodiment, and vice versa.

Further details and advantages of the invention will become apparent from the following description of some exemplary embodiments based on the figures.

Initially, a first substrate 1 having a first surface 11 and a second surface 12 located opposite the first surface is provided (see FIG. 1A).

The first substrate 1 is preferably present in the form of a wafer made of glass. In an alternative variant embodiment, however, the first substrate 1 can also be a wafer made of silicon or quartz, for example.

Here, the first surface 11 may, for example, be a section of a front wafer surface (wafer front side). Accordingly, the second surface 12 may be a section of a rear-side wafer surface (wafer rear side).

A structured etching mask 2 having at least one opening 20 is then produced on the first surface 11. The etching mask 2 may be a hard mask, such as a hard mask made of chromium. The etching mask 2 may, for example, be structured by means of photolithographic methods known per se. This is indicated in FIG. 1A by a structured layer made of resist 3a.

In the cross-sectional view shown in FIG. 1A, a corresponding structured etching of the material of the etching mask 2, for example chromium, has already taken place, as a result of which the opening 20 was produced.

Figure 1B:
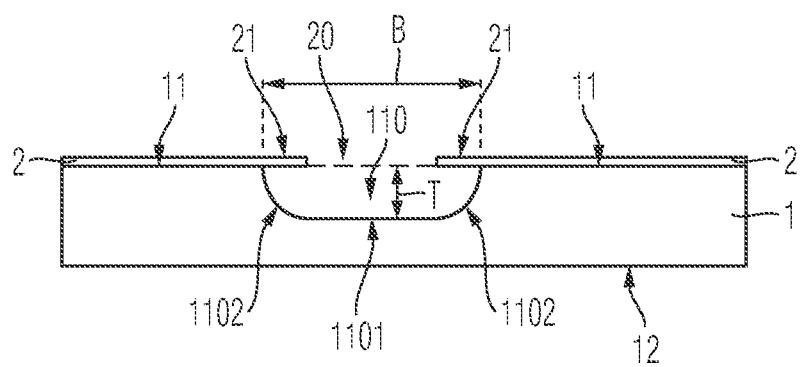

FIG. 1B illustrates how subsequently a recess 110 is created in the first surface 11 by means of etching in the region of the opening 20. Here, the material of the first substrate 1 (for example glass) is etched isotropically with an etchant, for example HF or KOH.

It is easily apparent in the schematic cross-sectional view according to FIG. 1B that the etching mask 2 is partially undercut laterally, so that lateral edge sections 21 of the etching mask 2 protrude beyond an edge of the recess 110. It also becomes clear from FIG. 1B that a bottom 1101 of the recess 110 has lateral roundings 1102 in a cross-section. The lateral roundings 1102 are etching radii that are formed during the isotropic etching.

The recess 110 thus produced may be a cavity or a channel in which, for example, a metallic electrode is to be subsequently arranged. For example, the recess 110 may take on the form of a channel having a depth T of up to several hundred nanometers, such as in the range of 0.05 μm to 5.0 μm, preferably in the range of 0.1 μm to 1.0 μm, such as 0.5 μm. A width B of the channel 110 may be in the range of 1 μm to 5000 μm, for example, and preferably in the range of 1 μm to 500 μm, such as 100 μm.

After the etching process, the etching mask 2 is initially not removed, but rather is left in place together with the edge sections 21 protruding laterally beyond the recess 110. In this way, the subsequent process steps for producing an electrically conductive structure 4 in the recess 110 are self-aligning, so that, for example, some processes can be carried out on the entire wafer 1 without a targeted alignment having to be carried out with the previously etched channel 110 (or, if preset, with a plurality of such channels 110).

This is to be clarified hereafter based on the further figures.

Figure 1C:
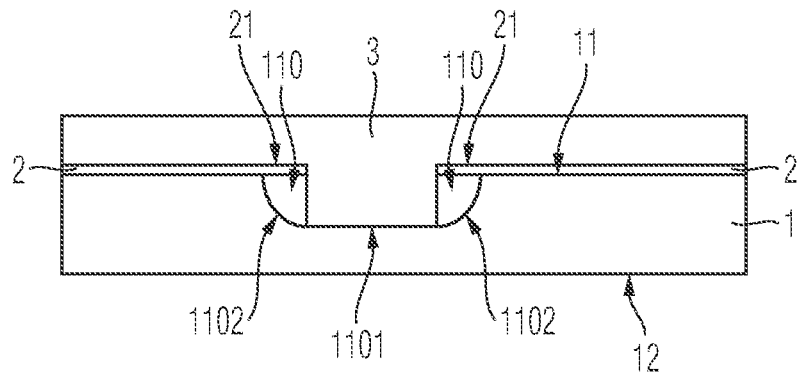

In a subsequent step, the wafer surface 1 may, for example, be coated again with a photoresist 3, 3b, for example by means of spin coating. As a result of this step, the photoresist 3, 3b covers the etching mask 2 as well as a portion of a bottom 1101 of the recess 110 below the opening 20, as shown in FIG. 1C. In contrast, the lateral etching radii 1102 below the protruding edge sections 21 of the etching mask 2 remain free of photoresist 3, 3b.

Figure 1D:
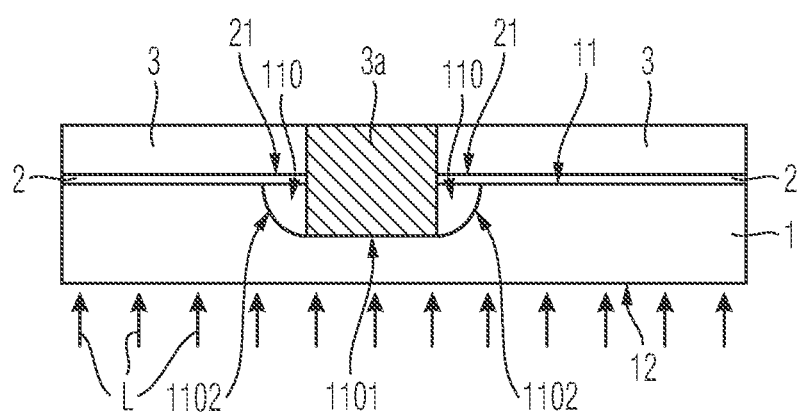

FIG. 1D shows another step in which the photoresist 3b is removed from the recess 110. This is accomplished in a self-aligning manner by means of an exposure and a subsequent development of the photoresist 3b in the recess 110. In the process, the (flood) exposure takes place through the second surface 12, i.e., from the rear side. This is indicated in FIG. 1D by vertical arrows L that point upwardly.

Since the material of the first substrate 1 (e.g., glass) is transparent to the light L used for exposing the photoresist 3b, while the material of the etching mask 2 (e.g., chromium) is not transparent to this light L, the photoresist 3b is deliberately removed from the recess 110 in a self-aligning manner. The exposed section of the photoresist 3b is shown hatched in FIG. 1D. However, the photoresist 3 remains in place on the etching mask 2.

Figure 1E:
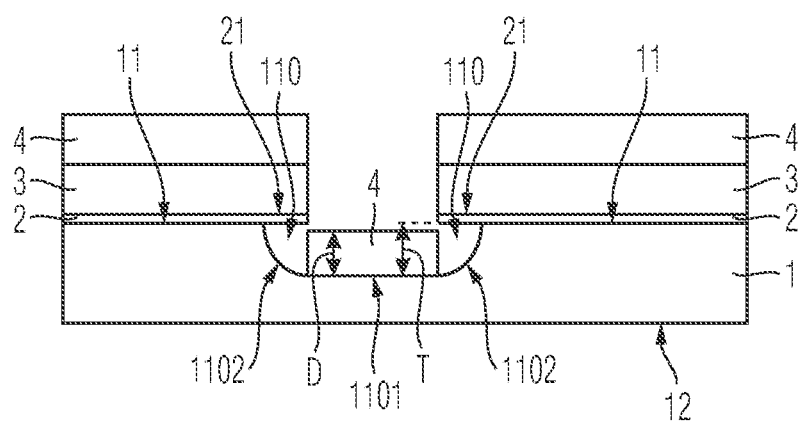

An electrically conductive material 4 is then deposited onto the photoresist 3 covering the etching mask 2 and onto a region of a bottom 1101 of the recess 110 below the opening 20, from which the photoresist 3b was previously removed. In this step, for example, a metallic layer 4 (e.g., gold) may be deposited across the entire surface of the wafer 1. This is schematically illustrated in FIG. 1E.

The deposition is preferably carried out in such a way that a resulting layer thickness D of the electrically conductive material 4 in the recess 110 is no more than a depth T of the recess 110. This ensures that the electrically conductive material 4 does not protrude from the recess 110 beyond the original first surface 11, and that later direct bonding, or other methods that require direct contact between the first surface 11 and another surface, are not impeded.

The lateral etching radii 1102 in the recess 110 are not coated during the deposition, i.e., they remain free of electrically conductive material 4.

Figure 1F:
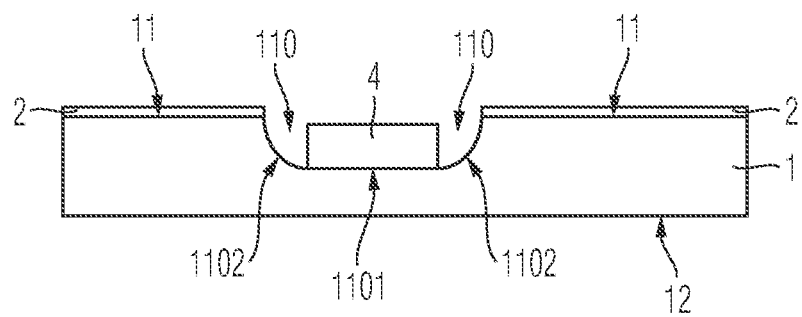

In a further step, the result of which is illustrated in FIG. 1F, a lift-off process removes the photoresist 3 (resist strip)

along with the electrically conductive material 4 arranged thereon, so that the electrically conductive material 4 remains only in the recess 110.

Figure 1G:
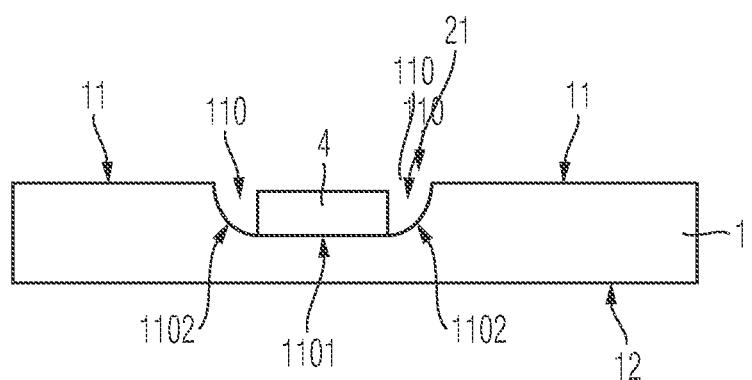

The method furthermore comprises removing the etching mask 2, for example by chromium etching, if the etching mask 2 is made of chromium. According to one variant, the photoresist 3 and the etching mask 2 can also be removed in one step. As is shown in FIG. 1G, the metal 4 recessed in the recess 110 as well as, surrounding the recess 110, the now exposed first surface 11 of the first substrate 1 thus remain as a result.

The first surface 11 is sufficiently clean and smooth for a subsequent direct bonding. Thus, the first surface may have a surface roughness of less than 0.5 nm, for example, after the removal of the etching mask 2.

Figure 1H:
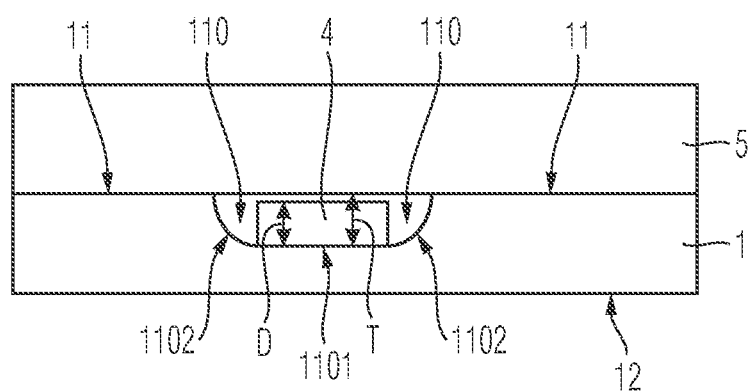

FIG. 1H illustrates the result of a subsequent process step in which a second substrate 5 is attached to the first surface 11 by means of direct bonding. The second substrate 5 closes the recess 110 toward the top in the manner of a cover. FIG. 1H thus shows a section of a cross-sectional view of a microfluidic device 6 according to the invention.

It may be provided in the process that the surface of the second substrate 5 used during the direct bonding also has a recess, this surface of the second substrate 5 being attached to the first surface 11 during the direct bonding in such a way that the recess 110 of the first substrate 1 and the recess of the second substrate 5 are located opposite one another. Thus, when the recessed metal electrode 4 is accommodated on the first substrate 1, and a microfluidic channel is accommodated on the second substrate 5, as shown, direct contact between a medium (fluid) in the microfluidic channel and the metal electrode 4 can be established.

Figure 2A:
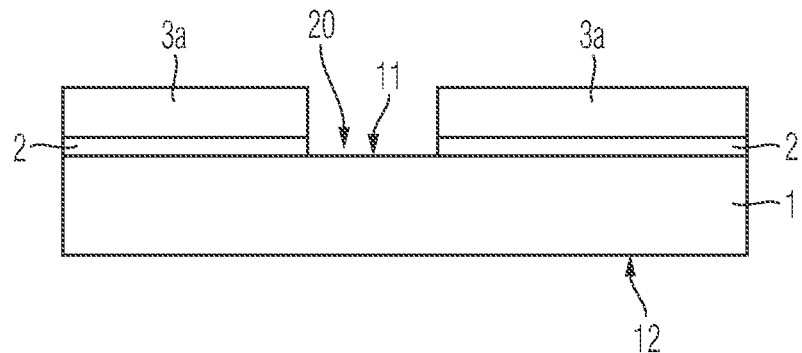
FIGS. 2A-D schematically and by way of example show different steps and intermediate stages in a method for manufacturing a microfluidic device according to one or more further exemplary embodiments.
Figure 2B:
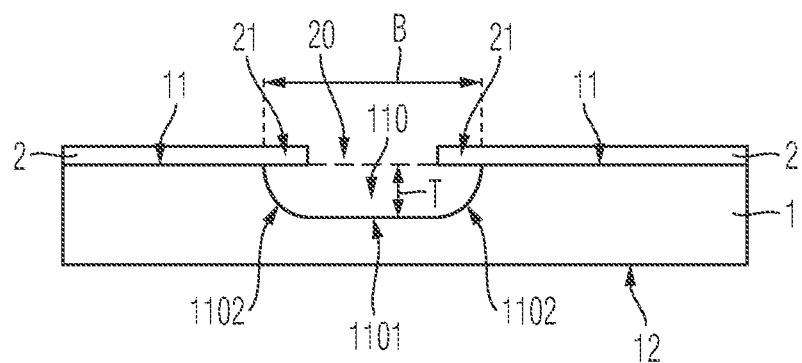
Figure 2C:
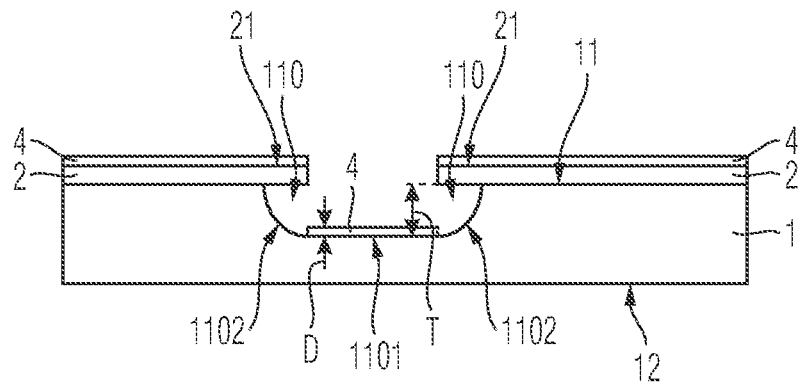
Figure 2D:
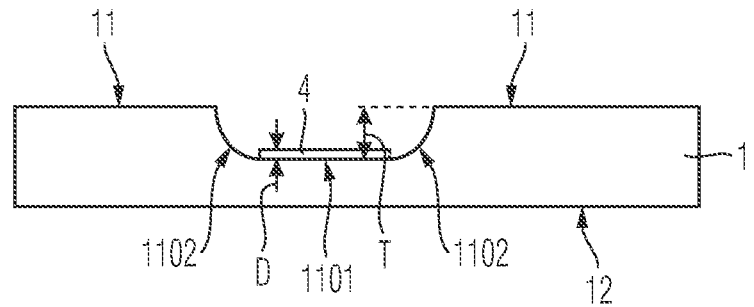

FIGS. 2A-D schematically and by way of example illustrate a further variant embodiment of the provided method. The steps illustrated in FIGS. 2A-B are identical to those explained with respect to FIGS. 1A-B. In this regard, reference is made to what was said above. However, in contrast to the exemplary embodiment according to FIGS. 1A-H (in particular FIGS. 1C-E there), the use of the photoresist 3 may subsequently be dispensed with. The deposition of the electrically conductive material 4, for example gold, may thus instead take place directly onto the etching mask 2 (for example made of chromium), as illustrated in FIG. 2C. The etching mask 2, together with the conductive material 4 deposited thereon, may then be removed by means of etching (FIG. 2D).

In this variant, the etching mask 2 itself (without photoresist) accordingly has the function of a "lift-off barrier" for the electrically conductive material 4. For this purpose, it is advantageous if the layer thickness D of the electrically conductive material 4 is less than or equal to a layer thickness of the etching mask 2, and thus allows etching of the etching mask 2 when the electrically conductive material 4 has already been deposited thereon. Such a lift-off process is furthermore promoted if many channels 110 are present, which allow the electrically conductive layer 4 to be undercut by an etchant, and thus the etching mask 2 to be attacked.

While embodiments of the invention have been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE SIGNS

1 First substrate
11 First surface
110 Recess/channel
1101 Bottom
1102 Roundings
12 Second surface
2 Etching mask
20 Opening
21 Edge sections
3, 3a Photoresist
3b Exposed section
4 Electrically conductive material
5 Second substrate
6 Microfluidic device
B Width
D Layer thickness of the electrically conductive material
L Light
T Depth

What is claimed is:

1. A method for manufacturing a microfluidic device, the method comprising:
   providing a first substrate having a first surface and a second surface located opposite the first surface;
   producing an etching mask on the first surface, the etching mask having an opening;
   producing, by etching, a recess in the first surface in a region of the opening;
   applying a photoresist onto the etching mask and onto a region of a bottom of the recess below the opening;
   removing the photoresist from the recess; and
   depositing an electrically conductive material onto the photoresist covering the etching mask, and onto the region of the bottom of the recess below the opening.

2. The method according to claim 1, wherein the etching mask is undercut at least partially laterally when the recess is produced such that at least one lateral edge section of the etching mask protrudes beyond an edge of the recess.

3. The method according to claim 1, wherein the removal of the photoresist from the recess comprises exposing the photoresist in the recess, the exposure taking place through the second surface.

4. The method according to claim 1, wherein the first substrate is transparent to light suitable for an exposure of the photoresist.

5. The method according to claim 1, wherein the etching mask is not transparent to light that is suitable for the exposure of the photoresist.

6. The method according to claim 1, wherein the first substrate is made of glass, quartz or silicon.

7. The method according to claim 1, further comprising removing the etching mask.

8. The method according to claim 7, wherein the first surface has a surface roughness of less than 0.5 nm after the removal of the etching mask.

9. The method according to claim 1, wherein a layer thickness of the electrically conductive material in the recess is no more than a depth of the recess.

10. The method according to claim 1, wherein a second substrate is attached to the first surface by wafer bonding.

11. The method according to claim 1, wherein a surface of a second substrate has a recess and is attached to the first surface such that the recess of the first substrate and the recess of the second substrate are located opposite one another.

* * * * *